United States Patent
Chang et al.

(12) 
(10) Patent No.: US 6,261,893 B1
(45) Date of Patent: Jul. 17, 2001

(54) METHOD FOR FORMING A MAGNETIC LAYER OF MAGNETIC RANDOM ACCESS MEMORY

(75) Inventors: Yen-Jung Chang, Yung-Ho; Yi-Chuan Yang, Hsin-Chuang; Jun-Jei Huang, Tainan; Mo-Chung Tseng, Chi-Lung, all of (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/686,932

(22) Filed: Oct. 12, 2000

(30) Foreign Application Priority Data

Aug. 30, 2000 (TW) .............................................. 089117594

(51) Int. Cl.$^7$ .............................................. H01L 21/8242
(52) U.S. Cl. ................................ 438/238; 438/3; 438/381
(58) Field of Search .................................... 438/238–241, 438/3, 250–256, 381, 393–396

(56) References Cited

U.S. PATENT DOCUMENTS 5,956,267 * 9/1999 Hurst et al. ........................... 365/158
6,165,803 * 12/2000 Chen et al. ............................... 438/3

* cited by examiner

*Primary Examiner*—Jey Tsai

(57) ABSTRACT

The present invention relates to a method for forming a magnetic layer of magnetic random access memory. In short, the method comprises following steps: providing a substrate; forming metal structures on substrate; forming a stop layer on substrate and mostly conformally covers metal structures; forming a buffer layer which mostly conformally covers stop layer; forming a dielectric layer on buffer layer where thickness of dielectric layer is larger than height of metal structures; planarizing the surface of said dielectric layer; and forming a magnetic layer on dielectric layer. Moreover, some essential key-points of the method are dielectric layer is more sensitive to said stop layer than buffer layer and gap fill ability of dielectric layer is better than gap fill ability of buffer layer.

12 Claims, 5 Drawing Sheets

METHOD FOR FORMING A MAGNETIC LAYER OF MAGNETIC RANDOM ACCESS MEMORY

BACKGROUND OF THE INVENTION

1. Field of the Invention

The present invention relates to a method for forming a magnetic layer of magnetic random access memory (MRAM) and more particularly to a method that effectively prevents quality of magnetic layer is degraded by uneven underlying layer.

2. Description of the Prior Art

A magnetic memory element has a structure that includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions as information which are called "Parallel" and "Anti-parallel" states, respectively. In response to Parallel and Anti-parallel states, the magnetic memory element represents two different resistances. The resistance indicates minimum and maximum values when the magnetization vectors of two magnetic layers point in substantially the same and opposite directions, respectively. Accordingly, a detection of changes in resistance allows an MRAM device to provide information stored in the magnetic memory element.

An MRAM devices integrates magnetic memory elements and other circuits, for example, a control circuit for magnetic memory elements, comparators for detecting states in a magnetic memory element, input/output circuits, etc. There circuits usually are fabricated in the process of complementary metal-oxide semiconductor (CMOS) technology in order to lower the power consumption of the MRAM device.

In addition, a magnetic memory element includes some very thin layers, some of them are about tens of angstroms thick. The performance of the magnetic memory element is sensitive to the surface conditions on which magnetic layers are deposited. Accordingly, it is necessary to make a flat surface to prevent the characteristics of an MRAM device (or magnetic layer) from degrading.

In conventional structure of MRAM, magnetic layer 10 usually is located on dielectric layer 11 that covers substrate where some metal structures 13 locates on, as FIG. 1A shows. However, owing to limitation of practical fabrication, it is usually unavoidable that some voids 14 exist inside dielectric 11 layer. Therefore, voids 14 maybe exposed after sequentially chemical mechanical polish process when location of voids is closed to surface of dielectric layer 11, and then quality of magnetic layer 10 is possibly stochastically degraded for surface of dielectric layer 11 possibly is not flat, refers to FIG. 1B. Moreover, size of voids 14 is increased and distance between voids 14 and surface of dielectric layer 11 is decreased whenever aspect ratio is increased by stop layer 15, as shown in FIG. 1C. Certainly, defect of voids 14 can be effectively prevent by application of dielectric layer 11 which with high gap fill ability. However, quality of magnetic layer 10 stronger relies on flat of surface of underlying dielectric layer 11, but surface of dielectric layer 11 maybe not flat when dielectric layer 11 is sensitive to substrate 12 (or stop layer 15) and then structure of dielectric layer 11 is porous, as FIG. 1D shows. Though dielectric layer 11 with high gap fill ability possibly replaces voids 14 by porous structure, and then quality of magnetic layer 10 still is degraded. For example, when stop layer 15 is silicon nitride layer and dielectric layer 11 is high O3 tetraethyl-orthosilicate SiO2 layer, high gap fill ability of high O3 tetraethyl-orthosilicate SiO2 layer can reduces formation of voids 14 but structure of high O3 tetraethyl-orthosilicate SiO2 layer also is porous. In addition, formation of voids can be effectively prevented by application of high density plasma. However, cost of high density plasma is large and then application of high density plasma is limited.

Correspondingly, quality of magnetic layer is important for magnetic random access memory and then how to provide a flat underlying layer for formation of magnetic layer is a needle technology in contemporary semiconductor field.

SUMMARY OF THE INVENTION

A principal object of the present invention is to provide a manufacturable method for forming a magnetic layer of magnetic random access memory.

Another object of the present invention is to provide a method that forming a goodly magnetic layer by effectively preventing underlying layer is uneven or is porous.

Objects of the invention further comprise forming a void free sheathing layer on an uneven substrate.

One preferred embodiment of the invention is a method for forming a magnetic layer of magnetic random access memory that comprises following steps: providing a substrate; forming metal structures on substrate; forming a stop layer on substrate and mostly conformally covers metal structures; forming a buffer layer which mostly conformally covers stop layer; forming a dielectric layer on buffer layer where thickness of dielectric layer is larger than height of metal structures; planarizing the surface of said dielectric layer; and forming a magnetic layer on dielectric layer. Moreover, some essential key-points of the method are dielectric layer is more sensitive to said stop layer than buffer layer and gap fill ability of dielectric layer is better than gap fill ability of buffer layer.

In short, application of buffer layer is one main characteristic of the invention. Herein, buffer layer is less sensitive to substrate (or stop layer) than sheathing layer and then buffer layer is not porous. Beside, gap fill ability of sheathing layer is good and then formation of voids can be properly prevented.

BRIEF DESCRIPTION OF THE DRAWINGS

In the accompanying drawing forming a material part of this description, there is shown.

DESCRIPTION OF THE PREFERRED EMBODIMENT

To detailedly explain the invention, some figures are used to illustrate essential steps of two preferred embodiments of the invention and are discussed in following paragraphs. Present embodiments comprises a method for forming a magnetic layer of magnetic random access memory and a method for forming a void free sheathing layer on an uneven substrate.

Figure 1A:
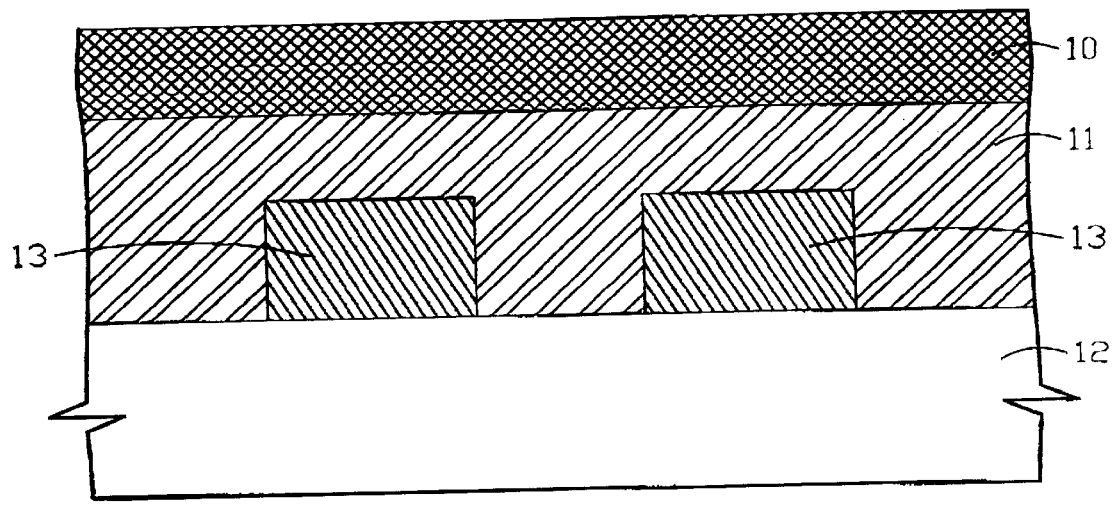
FIG. 1A to FIG. 1D are a series of qualitative cross-section illustrations about conventional structure of magnetic random access memory and common defects.
Figure 1B:
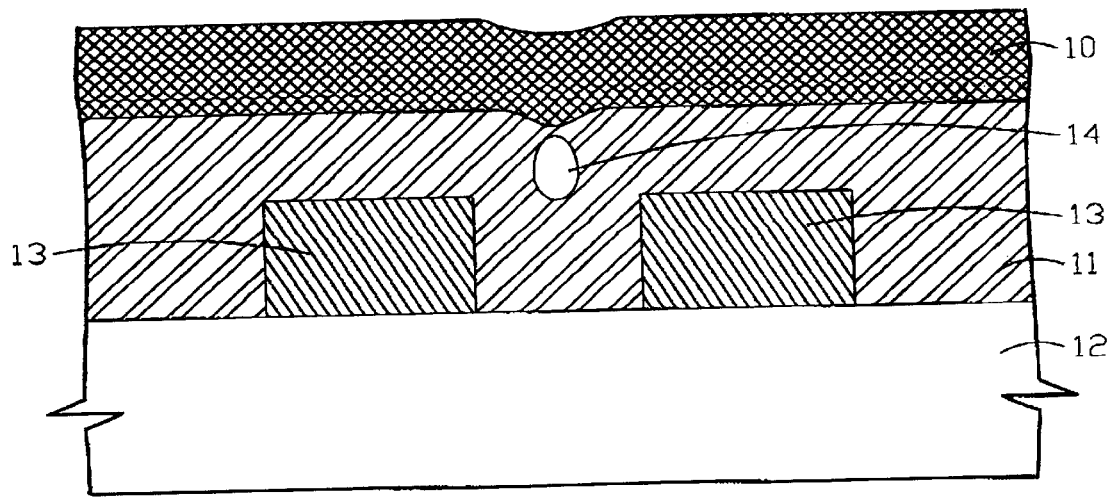
Figure 1C:
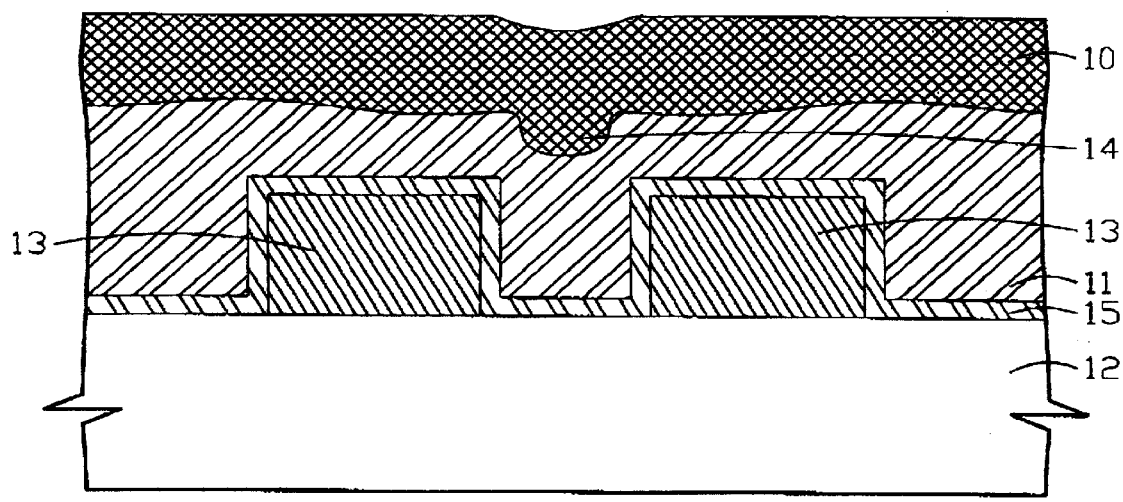
Figure 1D:
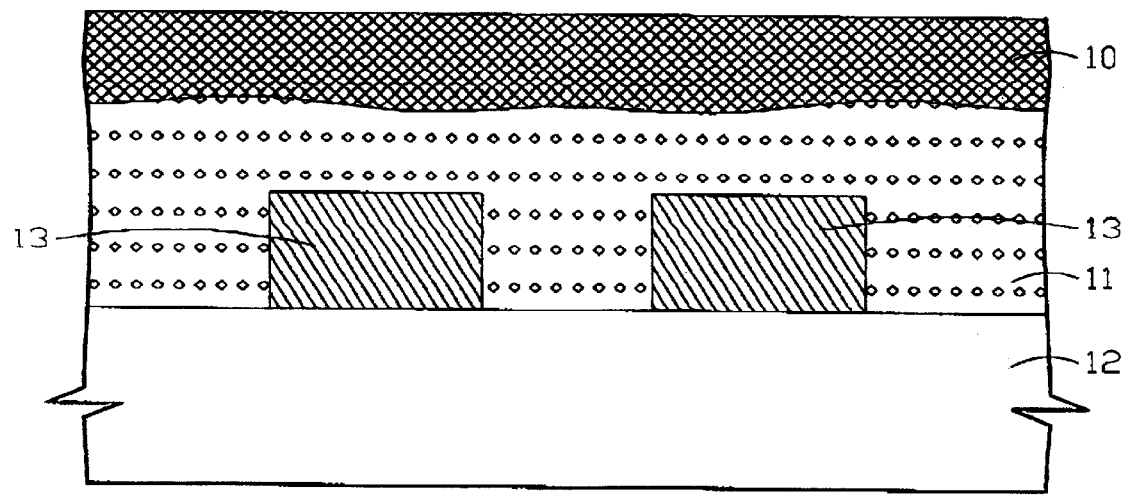
Figure 2A:
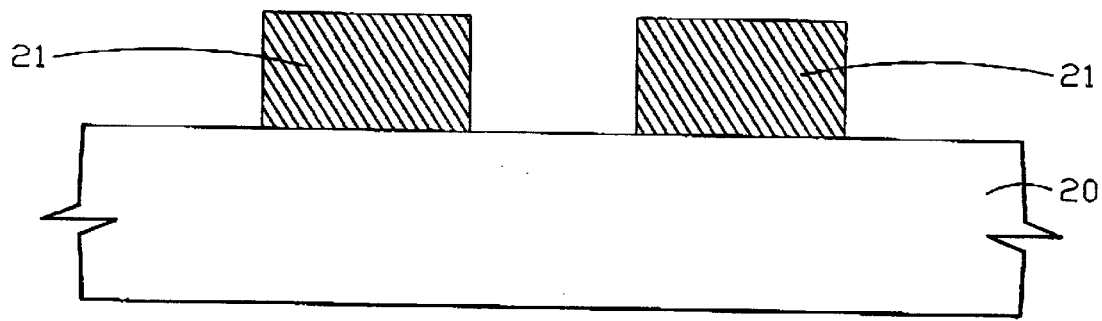
FIG. 2A to FIG. 2E are a series of qualitative cross-section illustrations about essential steps of one preferred embodiment of the invention.

First preferred embodiment is related to fabrication of MRAM and comprises following essential steps that are illustrated in some non-proportional figures:

First of all, as FIG. 2A shows, provides substrate 20 and then forms some metal structures 21 on substrate 20. Beside, because MRAM is combination of magnetic layer and RAM, Substrate 20 usually comprises a transistor inside and further comprises a circuitry that is fabricated by a complimentary metal oxide semiconductor process. Further, available varieties of metal structures 21 comprise metal lines.

Figure 2B:
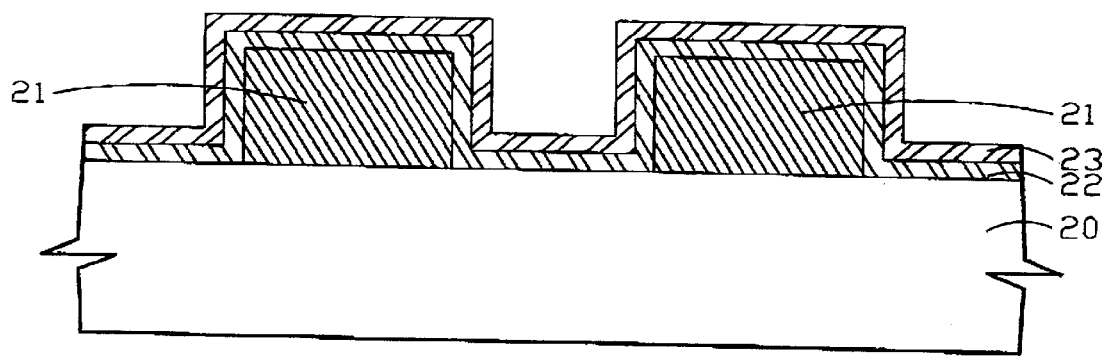

Then, as shown in FIG. 2B, forms stop layer 22, such as silicon nitride layer, on substrate 20 with a thickness about 2000 angstroms to 3000 angstroms, where stop layer 22 also mostly conformally covers metal structures 21. And then forms buffer layer 23 that mostly conformally covers stop layer 22, herein buffer layer 23 usually is low O3 tetraethyl-orthosilicate SiO2 layer or plasma enhanced silicon nitride layer. Beside, utility of buffer layer 23 is not to fill the gap between neighboring metal structures 21 and typical thickness of buffer layer 23 is about larger than 800 angstroms.

Figure 2C:
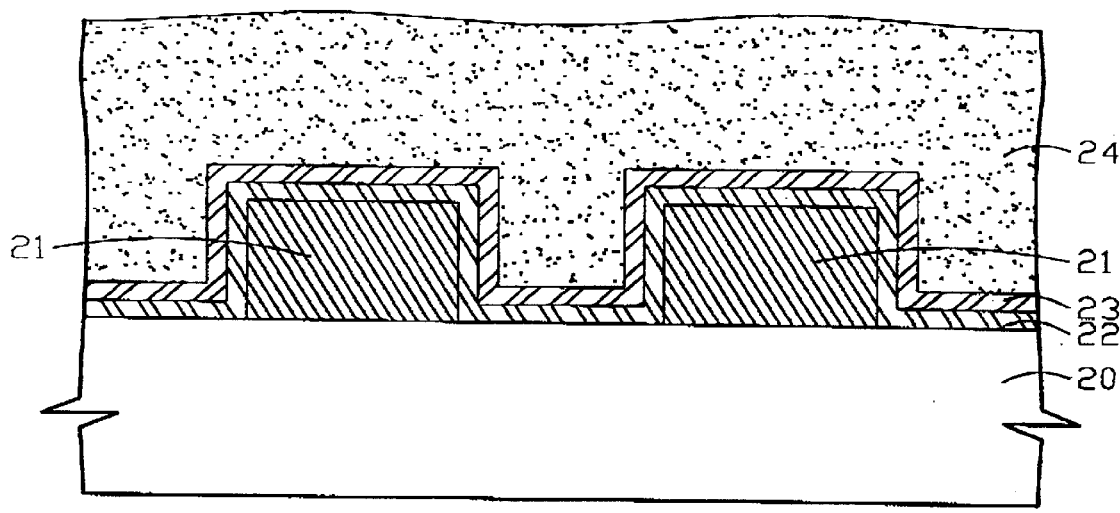
Figure 2D:
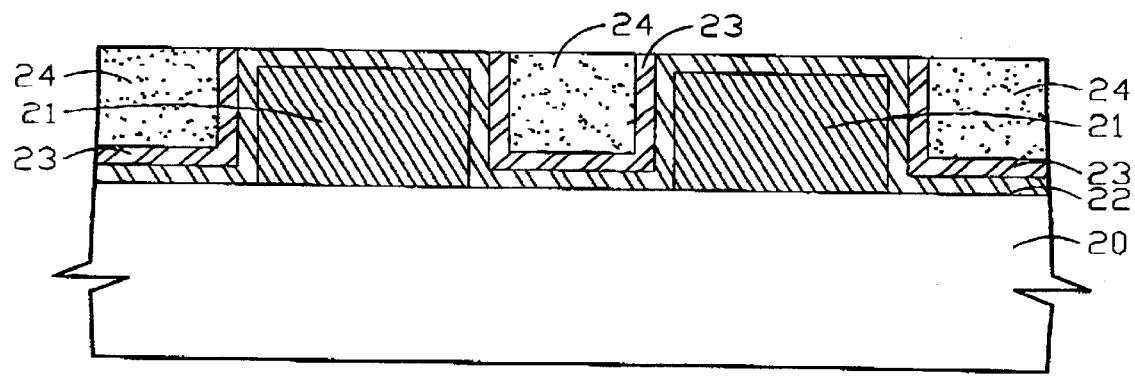

Next, refers to FIG. 2C, forms dielectric layer 24, such as high O3 tetraethyl-orthosilicate SiO2 layer, on buffer layer 23, where thickness of dielectric layer 24 is larger than height of metal structures 21 and typical thickness of dielectric layer 24 is about 4000 angstroms. And then perform a planarize process to planarize the surface of dielectric layer 24, as FIG. 2D shows, herein thickness of dielectric layer 24 is about 2000 angstroms after planarize process and metal structures 21 are not bared after planarize process. Beside, planarize process usually is an etching process or a chemical mechanical polish process.

However, it should be noted in the present method not only dielectric layer 24 usually is more sensitive to substrate 20 and/or stop layer 21 than buffer layer 23 but also gap fill ability of dielectric layer 24 must be better than gap fill ability of buffer layer 23. In this way, porous structure of dielectric layer 24 can be effectively prevent by properly choosing material of both buffer layer 23 and dielectric layer 24 to minimize sensitivity between buffer layer 23 and dielectric layer 24. Beside, probability of formation of voids also is effectively minimized by high gap fill ability dielectric layer 24 that fills gap between neighboring metal structures 21.

Sequentially processes at least includes a removal process for reducing thickness of layers (stop layer 22, buffer layer 23 and dielectric layer 24) that locates on metal structures 21 to about 2000 angstroms, whereby removal process usual is an etching process or a chemical mechanical polishing process. Further, because etching rate and/or polishing rate of stop layer 22 is less than that of buffer layer 23 or that of dielectric layer 24, it is possible to effectively control thickness of dielectric layer on metal structures 21, as FIG. 2D shows.

Figure 2E:
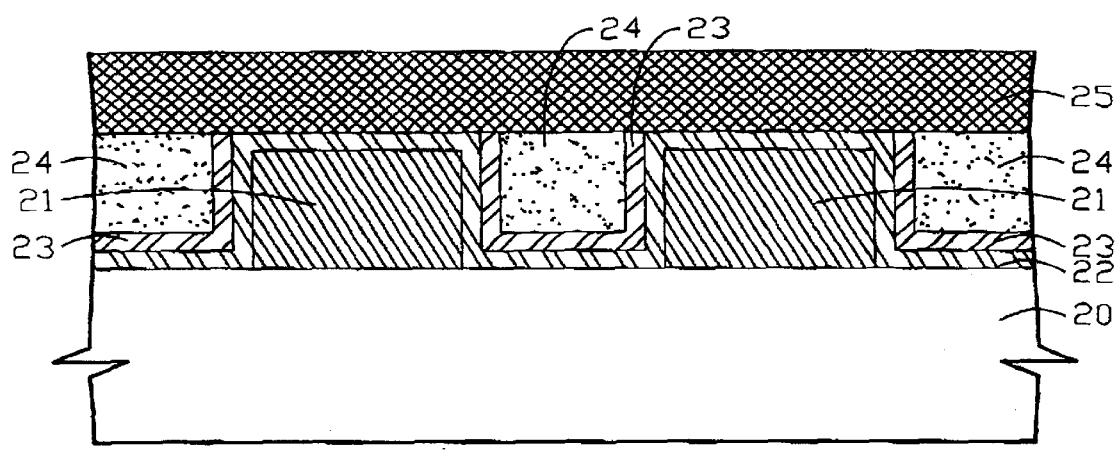

Finally, forms magnetic layer 25 on stop layer 21, as FIG. 2E shows. Noted, top surface of stop layer 21 is flat now, quality of magnetic layer 25 is not degraded by uneven underlying layer.

Furthermore, because forming process of both low O3 tetraethyl-orthosilicate SiO2 layer and high O3 tetraethyl-orthosilicate SiO2 layer are essential similar to conventional forming process of tetraethyl-orthosilicate SiO2 layer, and the main difference is that flow ration between O3 and tetraethyl-orthosilicate is smaller for low $O_3$ tetraethyl-orthosilicate SiO2 layer but flow ration between O3 and tetraethyl-orthosilicate is larger for high O3 tetraethyl-orthosilicate SiO2 layer. It is obviously that the present method is practical and manufacturable method.

Although specific embodiment has been illustrated and described, it will be obvious to those skilled in the art that various modifications may be made without departing from what is intended to be limited solely by the appended claims.

What is claimed is:

1. A method for forming a magnetic layer of magnetic random access memory, said method comprising following steps:

provviding a substrate which comprises a transistor inside;

forming a plurality of metal structures on said substrate;

forming a stop layer on said substrate, wherein said stop layer mostly conformally covers said metal structures;

forming a buffer layer which mostly conformally covers said stop layer;

forming a dielectric layer on said buffer layer, wherein thickness of said dielectric layer is larger than height of said metal structures;

performing a removal process to remove both part of said dielectric layer and part of said buffer layer to let the top surface of said metal structures is only covered by said stop layer; and forming a magnetic layer on said dielectric layer.

2. The method according to claim 1, wherein said substrate further comprising a circuitry which is fabricated by a complimentary metal oxide semiconductor process.

3. The method according to claim 1, wherein said metal structures are metal lines.

4. The method according to claim 1, wherein said stop layer is silicon nitride layer.

5. The method according to claim 1, wherein said buffer layer is a low O3 tetraethyl-orthosilicate SiO2 layer.

6. The method according to claim 1, wherein said buffer layer is a plasma enhanced silicon nitride layer.

7. The method according to claim 1, wherein thickness of said buffer layer is about between 800 angstroms to 2000 angstroms.

8. The method according to claim 1, wherein thickness of said dielectric layer is larger than about 4000 angstroms.

9. The method according to claim 1, wherein said dielectric layer is a high O3 tetraethyl-orthosilicate SiO2 layer.

10. The method according to claim 1, wherein thickness of said stop layer on the top surface of said metal structure is about 1500 angstroms to 2000 angstroms after said removal process is finished.

11. The method according to claim 1, wherein said removal process is an etching process.

12. The method according to claim 1, wherein said removal process is a chemical mechanical polish process.

* * * * *